United States Patent
Yang

(10) Patent No.: US 9,907,203 B2
(45) Date of Patent: Feb. 27, 2018

(54) FAN CONTROL CIRCUIT

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventor: Meng-Liang Yang, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 357 days.

(21) Appl. No.: 14/797,914

(22) Filed: Jul. 13, 2015

(65) Prior Publication Data

US 2017/0006734 A1    Jan. 5, 2017

(30) Foreign Application Priority Data

Jul. 2, 2015  (CN) .......................... 2015 1 0380163

(51) Int. Cl.
*G05B 15/02*    (2006.01)
*H05K 7/20*    (2006.01)

(52) U.S. Cl.
CPC ......... *H05K 7/20209* (2013.01); *G05B 15/02* (2013.01)

(58) Field of Classification Search
CPC ........... H05K 7/20209; H05K 7/20136; H05K 7/20172; G05B 15/02

USPC ......................................................... 700/282
See application file for complete search history.

(56) References Cited

U.S. PATENT DOCUMENTS

| | | | | |
|---|---|---|---|---|
| 3,524,997 | A * | 8/1970 | Harnden, Jr. ........... | G05F 1/445 315/196 |
| 4,091,460 | A * | 5/1978 | Schuermeyer ........ | G11C 11/402 327/208 |
| 4,438,766 | A * | 3/1984 | Bowers .................. | A61B 18/12 606/37 |
| 4,559,943 | A * | 12/1985 | Bowers .................. | A61B 18/12 606/37 |
| 5,148,255 | A * | 9/1992 | Nakazato ............ | H01L 27/0214 257/370 |
| 5,324,982 | A * | 6/1994 | Nakazato ............ | H01L 27/0214 257/355 |
| 7,026,729 | B2 * | 4/2006 | Homan .................. | F24F 7/007 307/139 |
| 2002/0063262 | A1 * | 5/2002 | Matsuzaki ............... | G11C 5/00 257/200 |
| 2008/0106228 | A1 * | 5/2008 | Ye ...................... | H05K 7/20209 318/479 |

(Continued)

*Primary Examiner* — Jason D Mitchell
(74) *Attorney, Agent, or Firm* — ScienBiziP, P.C.

(57) ABSTRACT

A fan control circuit includes a power supply module, a timing circuit, and a switching circuit. The switching circuit is coupled to the timing circuit and is configured to couple to a fan module. The power supply module is coupled to the switching circuit and is capable of supplying power to the fan module via the switching circuit. The timing circuit is configured to output a first control signal to the switching circuit after receiving an input starting signal. The switching circuit is configured to deactivate after receiving the first control signal, thereby enabling the power supply module to stop supplying power to the fan module.

20 Claims, 2 Drawing Sheets

(56) References Cited

U.S. PATENT DOCUMENTS

2012/0091937 A1\* 4/2012 Hsieh ................. G01R 19/00
                                                                                      318/471
2017/0027080 A1\* 1/2017 Jang ................. H05K 7/20209

\* cited by examiner

FAN CONTROL CIRCUIT

FIELD

The subject matter herein generally relates to fan control circuits.

BACKGROUND

In a computer system, a plurality of modules, such as a CPU and disks, generate heat when in operation. A fan control circuit may be used to control fans to cool modules.

BRIEF DESCRIPTION OF THE DRAWINGS

Implementations of the present technology will now be described, by way of example only, with reference to the attached figures.

DETAILED DESCRIPTION

Figure 1:
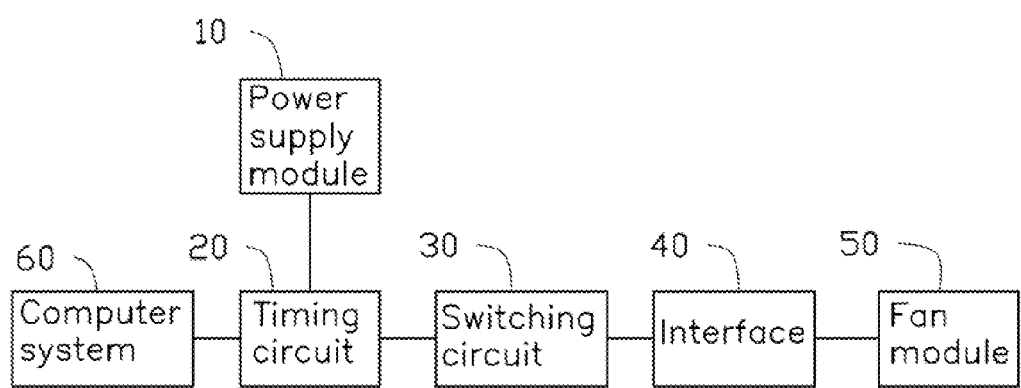
FIG. 1 is a block diagram of one embodiment of a fan control circuit.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series, and the like.

The present disclosure is described in relation to a fan control circuit to control power provision to fans.

FIG. 1 illustrates an embodiment of a fan control circuit. The fan control circuit comprises a power supply module 10, a timing circuit 20, and a switching circuit 30 coupled to the timing circuit 20. The power supply module 10 is configured to supply power to the timing circuit 20 and the switching circuit 30.

The switching circuit 30 is configured to couple to a fan module 50 via an interface 40, thereby enabling the power supply module 10 to supply power to the fan module 50 via the switching circuit 30 and the interface 40. The fan module 50 comprises a plurality of fans (not shown). The timing circuit 20 is configured to receive a starting signal S from a computer system 60. The starting signal S is a power on signal for powering on the computer system 60.

Figure 2:
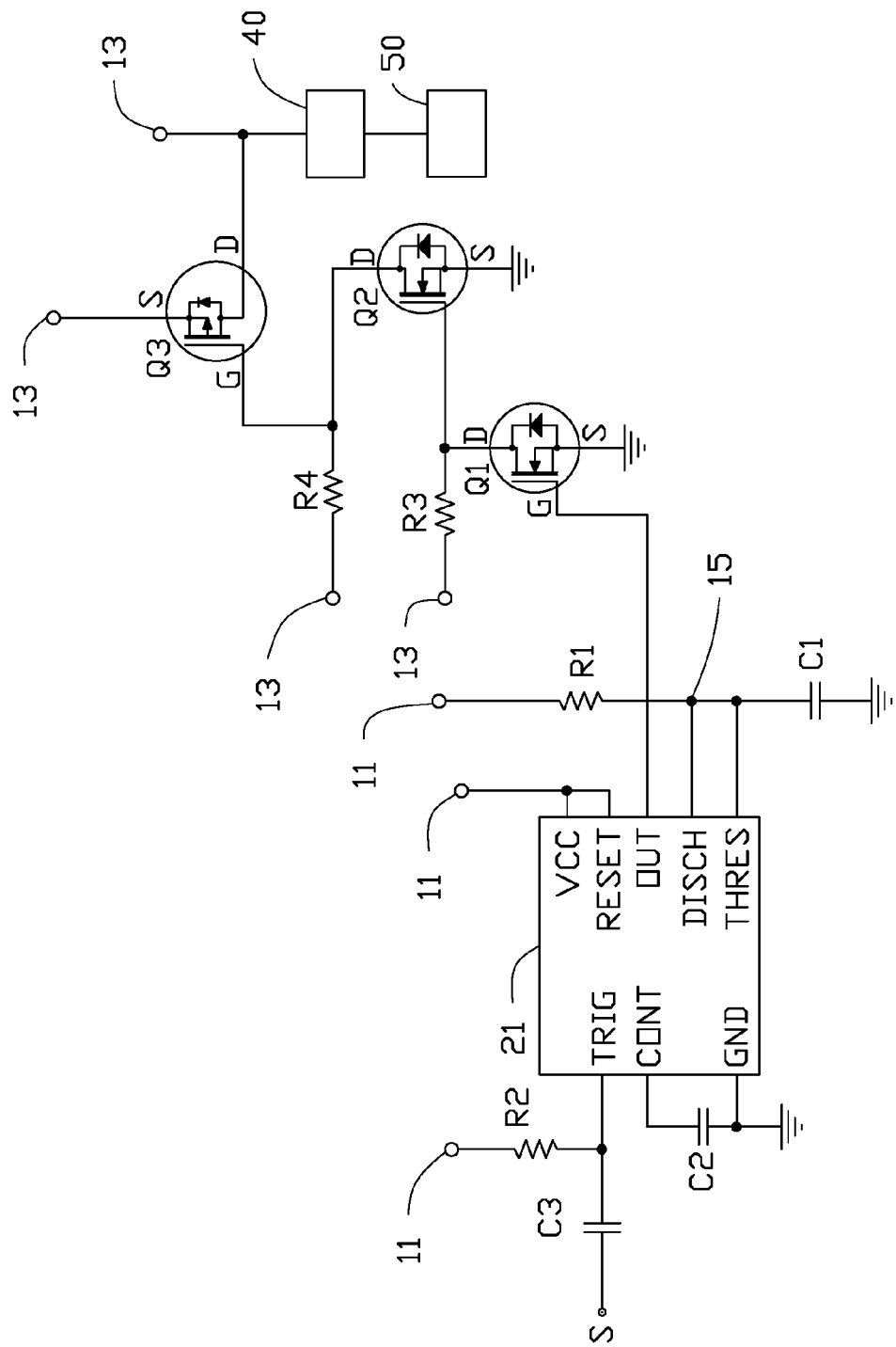
FIG. 2 is a circuit diagram of one embodiment of the fan control circuit.

FIG. 2 illustrates that the power supply module 10 comprises a first power supply 11 and a second power supply 13. In one embodiment, the first power supply 11 is configured to provide a 3V voltage and the second power supply 13 is configured to provide a 12V voltage.

The timing circuit 20 comprises a timer chip 21, a first resistor R1, and a first capacitor C1. The timer chip 21 comprises a ground terminal GND, a trigger terminal TRIG, an output terminal OUT, a reset terminal RESET, a control terminal CONT, a threshold terminal THRES, a discharging terminal DISCH, and a power supply terminal VCC. In one embodiment, a type of the timer chip 21 is NE555DR.

The switching circuit 30 comprises a first field effect transistor (FET) Q1, a second FET Q2, and a third FET Q3. Each of the first FET Q1, the second FET Q2, and the third FET Q3 comprises a control terminal G, a first connecting terminal S, and a second connecting terminal D. In one embodiment, each of the first FET Q1 and the second FET Q2 is an n-channel metal oxide semiconductor (MOS), the third FET Q3 is a p-channel MOS, each control terminal G is a gate terminal, each first connecting terminal S is a source terminal, and each second connecting terminal D is a drain terminal.

The ground terminal GND of the timer chip 21 is grounded. The ground terminal GND of the timer chip 21 is coupled to the control terminal CONT of the timer chip 21 via a second capacitor C2. The trigger terminal TRIG of the timer chip 21 is coupled to the first power supply 11 via a second resistor R2. The trigger terminal TRIG of the timer chip 21 is configured to receive the starting signal S via a third capacitor C3. The output terminal OUT of the timer chip 21 is coupled to the control terminal G of the first FET Q1. Each of the reset terminal RESET of the timer chip 21 and the power supply terminal VCC of the timer chip 21 is coupled to the first power supply 11. Each of the threshold terminal THRES of the timer chip 21 and the discharging terminal DISCH of the timer chip 21 is coupled to a node 15. The node 15 is coupled to the first power supply 11 via the first resistor R1. The node 15 via the first capacitor C1 is grounded.

The source terminal S of the first FET Q1 is grounded. The drain terminal D of the first FET Q1 is coupled to the control terminal G of the second FET Q2. The control terminal G of the second FET Q2 is coupled to the first power supply 11 via a third resistor R3. The source terminal S of the second FET Q2 is grounded. The drain terminal D of the second FET Q2 is coupled to the control terminal G of the third FET Q3. The control terminal G of the third FET Q3 is coupled to the second power supply 13 via a fourth resistor R4. The source terminal S of the third FET Q3 is coupled to the second power supply 13. The drain terminal D of the third FET Q3 is coupled to the second power supply 13. The drain terminal D of the third FET Q3 is coupled to the interface 40. The interface 40 is coupled to the fan module 50.

In use, when a computer is turned on, the trigger terminal TRIG of the timer chip 21 receives the starting signal S from the computer system 60. The output terminal OUT of the timer chip 21 outputs a first control signal to the control terminal G of the first FET Q1 to turn on the first FET Q1. The first control signal keeps a time T and the time T=1.1*R1*C1. During the time T, the first FET Q1 is switched on, the second FET Q2 is switched off, and the third FET Q3 is switched off, thereby disabling the second power supply 13 from supplying power to the fan module 50. After the time T, the output terminal OUT of the timer chip 21 outputs a second control signal to the control terminal G of the first FET Q1 to turn off the first FET Q1, thereby enabling the second FET Q2 to be switched on, thus the third FET Q3 is switched on, and the second power supply 13 can supply power to the fan module 50. In one embodiment, the first control signal is a high level signal and the second control signal is a low level signal.

In the fan control circuit, the timer chip 21 outputs the first control signal to the first FET Q1 after receiving the starting signal S. During the time T, the first FET Q1 is switched on, the second FET Q2 is switched off, and the third FET Q3 is switched off, thereby disabling the power supply module 10 from supplying power to the fan module 50, thus decreasing energy consumption.

It is to be understood that even though numerous characteristics and advantages have been set forth in the foregoing description of embodiments, together with details of the structures and functions of the embodiments, the disclosure is illustrative only and changes may be made in detail, including in the matters of shape, size, and arrangement of parts within the principles of the disclosure to the full extent indicated by the broad general meaning of the terms in which the appended claims are expressed.

What is claimed is:

1. A fan control circuit comprising:
a timing circuit;
a switching circuit coupled to the timing circuit and couplable to a fan module; and
a power supply module coupled to the switching circuit;
wherein the power supply module is capable of supplying power to the fan module via the switching circuit;
wherein the timing circuit is configured to output a first control signal to the switching circuit after receiving an input starting signal;
wherein the switching circuit is configured to deactivate after receiving the first control signal; and
wherein the power supply module is configured to stop supplying power to the fan module in event the switching circuit is not active;
wherein the switching circuit comprises a first field effect transistor (FET), a second FET, and a third FET, the timing circuit is coupled to the first FET, the second FET is coupled to the first FET, the second FET is coupled to the third FET, and the third FET is configured to couple to the fan module.

2. The fan control circuit of claim 1, wherein the timing circuit is further configured to output a second control signal after a time outputting the first control signal, the switching circuit is configured to be switched on after receiving the second control signal, and the power supply module is configured to supply power to the fan module when the switching circuit is switched on.

3. The fan control circuit of claim 1, wherein the timing circuit comprises a timer chip, the timer chip is coupled to the switching circuit, and the timer chip is configured to receiving the starting signal.

4. The fan control circuit of claim 3, wherein the timing circuit further comprises a first resistor and a first capacitor, the timer chip comprises a threshold terminal and a discharging terminal, and each of the threshold terminal of the timer chip and the discharging terminal of the timer chip is coupled to a same node between the first resistor and the first capacitor.

5. The fan control circuit of claim 4, wherein the timer chip further comprises a trigger terminal, the trigger terminal is configured to connect to the computer system via a second capacitor to receive the starting signal.

6. The fan control circuit of claim 5, wherein the first FET is configured to be switched on after receiving the first control signal, and the second FET is configured to be switched off after the first FET is switched on; a source terminal of the first FET is grounded, a drain terminal of the first FET is coupled to a control terminal of the second FET, a control terminal of the second FET is coupled to the first power supply via a third resistor, and a source terminal of the second FET is grounded.

7. The fan control circuit of claim 6, wherein the second FET is an n-channel metal oxide semiconductor (MOS).

8. The fan control circuit of claim 6, wherein the third FET is configured to be switched off after the second FET is be switched off; a drain terminal t of the second FET is coupled to a control terminal of a third FET, a control terminal of the third FET is coupled to a second power supply via a fourth resistor, a source terminal of the third FET is coupled to the second power supply, a drain terminal of the third FET is coupled to the second power supply, the drain terminal of the third FET is coupled to the interface.

9. The fan control circuit of claim 8, wherein the third FET is a p-channel MOS.

10. The fan control circuit of claim 1, wherein the switching circuit is configured to couple to the fan module via an interface, the power supply module can supply power to the fan module via the switching circuit and the interface.

11. A fan control circuit comprising:
a timing circuit;
a switching circuit coupled to the timing circuit and couplable to a fan module; and
a power supply module coupled to the switching circuit;
wherein the power supply module can supply power to the fan module via the switching circuit;
wherein the timing circuit is configured to:
output a first control signal to the switching circuit after receiving an input starting signal,
output a second control signal to the switching circuit after a time outputting the first control signal;
wherein the switching circuit is configured to deactivate after receiving the first control signal and activate after receiving the second control signal; and
wherein the power supply module is configured to stop supplying power to the fan module in event the switching circuit is not active and supply power to the fan module when the switching circuit is active;
wherein the switching circuit comprises a first field effect transistor (FET), a second FET, and a third FET, the timing circuit is coupled to the first FET, the second FET is coupled to the first FET, the second FET is coupled to the third FET, and the third FET is configured to couple to the fan module.

12. The fan control circuit of claim 11, wherein the timing circuit comprises a timer chip, the timer chip is coupled to the switching circuit, and the timer chip is configured to receiving the starting signal.

13. The fan control circuit of claim 12, wherein the timing circuit further comprises a first resistor and a first capacitor, the timer chip comprises a threshold terminal and a discharging terminal, and each of the threshold terminal of the timer chip and the discharging terminal of the timer chip is coupled to a same node between the first resistor and the first capacitor.

14. The fan control circuit of claim 13, wherein the timer chip further comprises a trigger terminal, the trigger terminal is configured to connect to the computer system via a second capacitor to receive the starting signal.

15. The fan control circuit of claim 14, wherein the first FET is configured to be switched on after receiving the first control signal, and the second FET is configured to be switched off after the first FET is switched on; a source terminal of the first FET is grounded, a drain terminal of the first FET is coupled to a control terminal of the second FET, a control terminal of the second FET is coupled to the first power supply via a third resistor, and a source terminal of the second FET is grounded.

16. The fan control circuit of claim 15, wherein each of the first FET and the second FET is an n-channel metal oxide semiconductor (MOS).

17. The fan control circuit of claim 15, wherein the third FET is configured to be switched off after the second FET is be switched off; a drain terminal t of the second FET is coupled to a control terminal of a third FET, a control terminal of the third FET is coupled to a second power supply via a fourth resistor, a source terminal of the third FET is coupled to the second power supply, a drain terminal of the third FET is coupled to the second power supply, the drain terminal of the third FET is coupled to the interface.

18. The fan control circuit of claim 17, wherein the third FET is a p-channel MOS.

19. The fan control circuit of claim 17, wherein the third FET is configured to couple to the fan module via an interface, the power supply module can supply power to the fan module via the switching circuit and the interface.

20. The fan control circuit of claim 11, wherein the first control signal is a high level signal.

* * * * *